United States Patent [19]

Landreau et al.

[11] Patent Number: 5,221,636
[45] Date of Patent: Jun. 22, 1993

[54] PROCESS AND APPARATUS FOR THE DEPOSITION OF ANTI-REFLECTION COATINGS AND THE CHECKING OF THEIR THICKNESS

[75] Inventors: Jean Landreau, Antony; Hisao Nakajima, Bagneux, both of France

[73] Assignee: France Telecom, Establissement autonome de droit public, Paris, France

[21] Appl. No.: 729,435

[22] Filed: Jul. 12, 1991

[30] Foreign Application Priority Data

Jul. 13, 1990 [FR] France ................. 90 08947

[51] Int. Cl.$^5$ ............... H01L 21/20; H01L 21/203
[52] U.S. Cl. ................. 437/129; 437/227; 437/235; 437/908; 437/966; 204/298.03; 204/298.04; 204/298.11; 204/298.28; 204/192.13
[58] Field of Search ............ 437/129, 8, 908, 227; 385/35; 372/45, 50; 204/298.03, 298.04, 298.11, 298.28, 298.13

[56] References Cited

U.S. PATENT DOCUMENTS 3,846,165 11/1974 Ettenberg et al. ............ 117/201
4,563,368 1/1986 Thihanyi et al. ............ 437/129
4,843,031 1/1989 Ban et al. ............ 437/129

OTHER PUBLICATIONS

Applied Optics, vol. 27, No. 8, Apr. 15, 1988, pp. 1391-1393.
Applied Optics, vol. 26, No. 5, Mar. 1, 1987, pp. 845-849.
IBM Technical Disclosure Bulletin, vol. 27, No. 8, Jan. 1985, pp. 4667-4668.

Primary Examiner—Olik Chaudhuri
Assistant Examiner—H. Jey Tsai
Attorney, Agent, or Firm—Pearne, Gordon, McCoy & Granger

[57] ABSTRACT

The present invention pertains to a method and apparatus for the deposition and measurement of anti-reflective coatings on non-resonating semiconductor laser amplifiers. Two faces (15-1, 15-2) of the amplifier (15) alternately receive the sputtered material in small quantities. The semiconducting structure is supplied with constant current (16) and the voltage (V) is measured at the terminals of the structure. When the coatings are deposited on both faces, the voltage increases and passes through a maximum corresponding to the reflectivity minimum at which point deposition of the coating is stopped. The two faces are treated in the same way with coatings of the same thickness.

8 Claims, 2 Drawing Sheets

PROCESS AND APPARATUS FOR THE DEPOSITION OF ANTI-REFLECTION COATINGS AND THE CHECKING OF THEIR THICKNESS

BACKGROUND OF THE INVENTION

The present invention relates to a process and an apparatus for the deposition of anti-reflection coatings and the checking of their thickness. It is more particularly used in the production of non-resonating semiconductor laser amplifiers for use in optical telecommunications.

It is known that an anti-reflection coating is a transparent coating, whose index end satisfies the relation $n^2 = n_0$, in which $n_0$ is the index of the substrate on which it is deposited and whose thickness e is equal to $\lambda/4n$, in which $\lambda$ is the wavelength of the radiation for which it is wished to eliminate the reflection.

For a given material, the coating thickness must be carefully adjusted. It is accepted that a "good" anti-reflection coating is one having a reflectivity below $10^{-3}$. This very low value imposes severe constraints on the thickness, which must be adjusted to better than $10^{-2}$. It is therefore relatively difficult to obtain good anti-reflection coatings.

Processes for checking the thickness of such coatings when they are deposited on the lateral faces of semiconductor structures are known. The article entitled "Real-time monitoring of laser diode facet reflectivity while being coated with $SiO_x$", published by A. SOMANI et al, in "Applied Optics", vol. 27, No. 8, April 1988, pp 1391-1393, describes a process in which a measurement is made of the light intensity emitted by the laser diode as a function of time. When this intensity passes through a minimum, the reflectivity also passes through a minimum and the deposition process is interrupted. U.S. Pat. No. 3,846,165 describes a process in which measurement takes place of the intensity of the radiation emitted by the laser, which is a function of the reflectivity of the deposited coating. When the measured power corresponds to the desired reflectivity, the deposition process is interrupted. The article by M. SERENYI et al entitled "Directly controlled deposition of anti-reflection coatings for semiconductor laser" published in "Applied Optics", Mar. 1, 1987, vol. 26, No. 5, pp 845-849, again describes a process in which the semiconductor structure is supplied with current and the spontaneous light intensity emitted through the coating during deposition is measured. A maximum lighting power is then sought.

All the above procedures suffer from numerous disadvantages. Firstly, the photoreceiver required must be positioned in such a way as to collect a maximum of light. However, this requirement is with the need of not masking the face to be treated. As this photoreceiver is sensitive to the light emitted in the deposition enclosure (by the sputtering gun or plasma), it is necessary to mask this parasitic light and use interferometric filters for this purpose, which reduce the lighting intensity to be measured. This reduction is all the more prejudicial, because at its minimum the intensity to be measured is already very low. Finally, there must be a strict alignment between the laser and the photoreceiver using lenses, mirrors, optical fibers, etc., all these means significantly complicating the installation.

Moreover, when these techniques are applied to non-resonating structures, which require that the two faces are given an anti-reflection treatment, new difficulties are encountered. Thus, on optimizing the thickness of the deposited coating one face after the other, a thickness asymmetry is created between the two finally-deposited coatings. This is due to the fact that during the anti-reflection treatment of the first face, the increase in the optical losses induces a spectral slip of the optical gain of the structure, which leads to a slightly different optimum thickness for the second face. In addition, during the treatment of the second face, a parasitic deposition is added to the already-treated first face, which will upset the first treatment.

SUMMARY OF THE INVENTION

The present invention aims at obviating all these disadvantages. It therefore proposes a process for the deposition of anti-reflection coatings and for checking their thickness, which is characterized in that the deposition takes place alternately on each of the two faces of the amplifier by successive, elementary deposits of limited thickness, the two faces being treated in this way simultaneously and symmetrically and the voltage is measured at the terminals of the optical amplifier and the passage of said voltage through a maximum is detected, which indicates that an overall reflectivity minimum has been obtained for the two coatings and deposition is then stopped.

Through operating alternately on the two faces and with small material quantities deposited, it is possible to obviate the disadvantage relative to the asymmetry of the treatments.

The use of a voltage (instead of the emitted lighting intensity) as the means for detecting the optimum thickness makes it possible to avoid the aforementioned disadvantages relative to optical systems.

The term "terminals" of the amplifier at which the voltage is measured, is understood to mean the two electrical contacts taken, on the one hand, on the substrate and, on the other hand, on the top of the structure. The faces on which the anti-reflection deposition takes place are generally cleaved faces. The injected current therefore circulates substantially perpendicularly to the plane of the semiconducting coatings and substantially parallel to the anti-reflection deposits.

The correlation between an optical quantity (the reflectivity of an anti-reflection coating) and an electrical quantity (the voltage at the terminals of the semiconducting structure) on which the invention is based is of a surprising nature. According to the inventors, it can be explained in the following way.

In a semiconductor laser structure, for a given injection current, the number of carriers in the active zone is inversely proportional to the number of photons present in the structure. The carrier density (i.e. the number of carriers per volume unit) determines the spacing of the quasi-Fermi levels and consequently the voltage at the terminals of the structure.

Moreover, the lighting intensity within the structure results from an equilibrium between the amplification by stimulated emission and the optical losses of the cavity. For a constant injection current, an increase of the losses linked with a decrease of the reflectivity of one of the faces leads to a decrease of the lighting intensity within the cavity. This decrease reduces the stimulated emission, which has the effect of increasing the density of carriers and therefore increases the voltage at the laser terminals.

Thus, seeking better anti-reflection coatings amounts to detecting a voltage maximum at the terminals of the semiconductor structure.

It will also be observed that with the prior art processes requiring a photoreceiver aligned with the face being treated, it was impossible to alternately present the two faces to be treated to the sputtering apparatus. However, this alternation is made possible by the measurement of the voltage.

The invention also relates to an apparatus for depositing anti-reflection coatings for performing the process described hereinbefore.

BRIEF DESCRIPTION OF THE DRAWINGS

The invention is described in greater detail hereinafter relative to non-limitative embodiments and the attached drawings, wherein.

DETAILED DESCRIPTION OF THE PREFERRED EMBODIMENT

Figure 1:
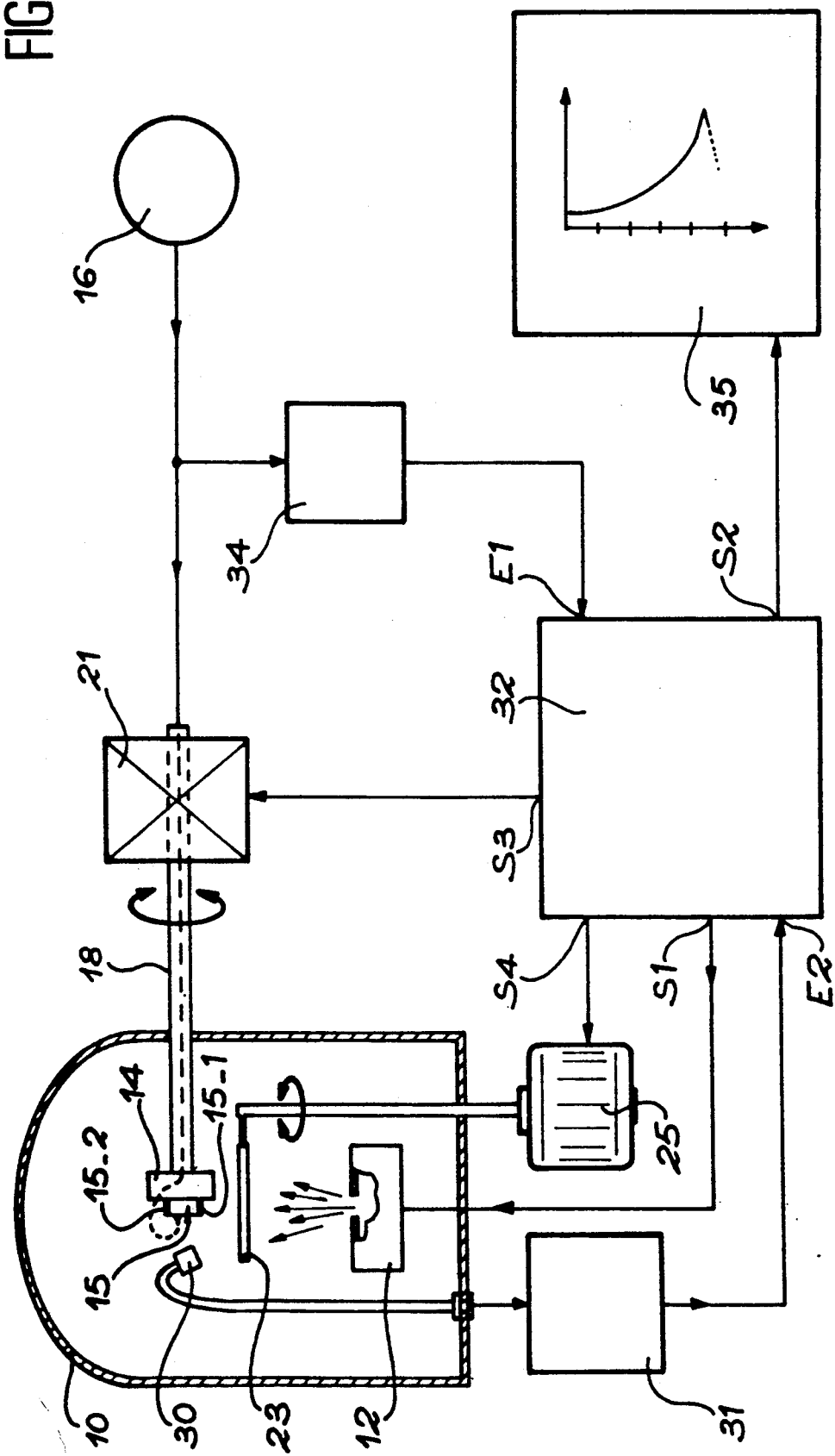
FIG. 1 shows an apparatus according to the present invention.

The apparatus shown in FIG. 1 has a deposition enclosure 10 equipped with a sputtering means 12, a sample holder 14 able to receive the optical amplifier 15, whose lateral faces 15-1 and 15-2 are to be treated. A constant current source 16 is connected to the sample holder 14 and supplies current to the optical amplifier 15 during deposition. The apparatus also has means 21 for pivoting half-turn by half-turn the sample holder 14, so that each of the two lateral faces 15-1, 15-2 of the amplifier are presented to the sputtering means 12; a voltmeter 34 measuring the voltage V at the terminals of the optical amplifier 15 (or, which amounts to the same thing, to the output of the current source 16); a retractable mask 23 located in the enclosure 10 between the sputtering means 12 and the sample holder 14, as well as a motor 25 able to control the position of the mask; means for measuring the thickness e of the deposit made and comprising a quartz support 30 and a quartz balance 31; and means 32 able to detect the instant where the said voltage V passes through a maximum and control the stopping of the sputtering means.

In the illustrated variant, the latter means 32 are constituted by a computer having a first input E1 connected to the voltmeter 34 and receiving therefrom the voltage V and a second input E2 connected to the means 30, 31 able to measure the thickness e of the deposit made.

The computer 32 determines the voltage variation dV, the thickness variation de, the ratio dV/de and the time at which the ratio becomes zero. It also has a first output S1 supplying a stop signal applied to the sputtering means 12 when the calculated dV/de ratio becomes zero, a second output S2 supplying the quantities dV and e, a third output S3 controlling the means 21 able to pivot the sample holder 14 by a half-turn and finally a fourth output S4 for controlling the motor 25 and for interposing the mask 23 between the sputtering means and the sample holder during the pivoting by half a turn of the support 14.

Figure 2:
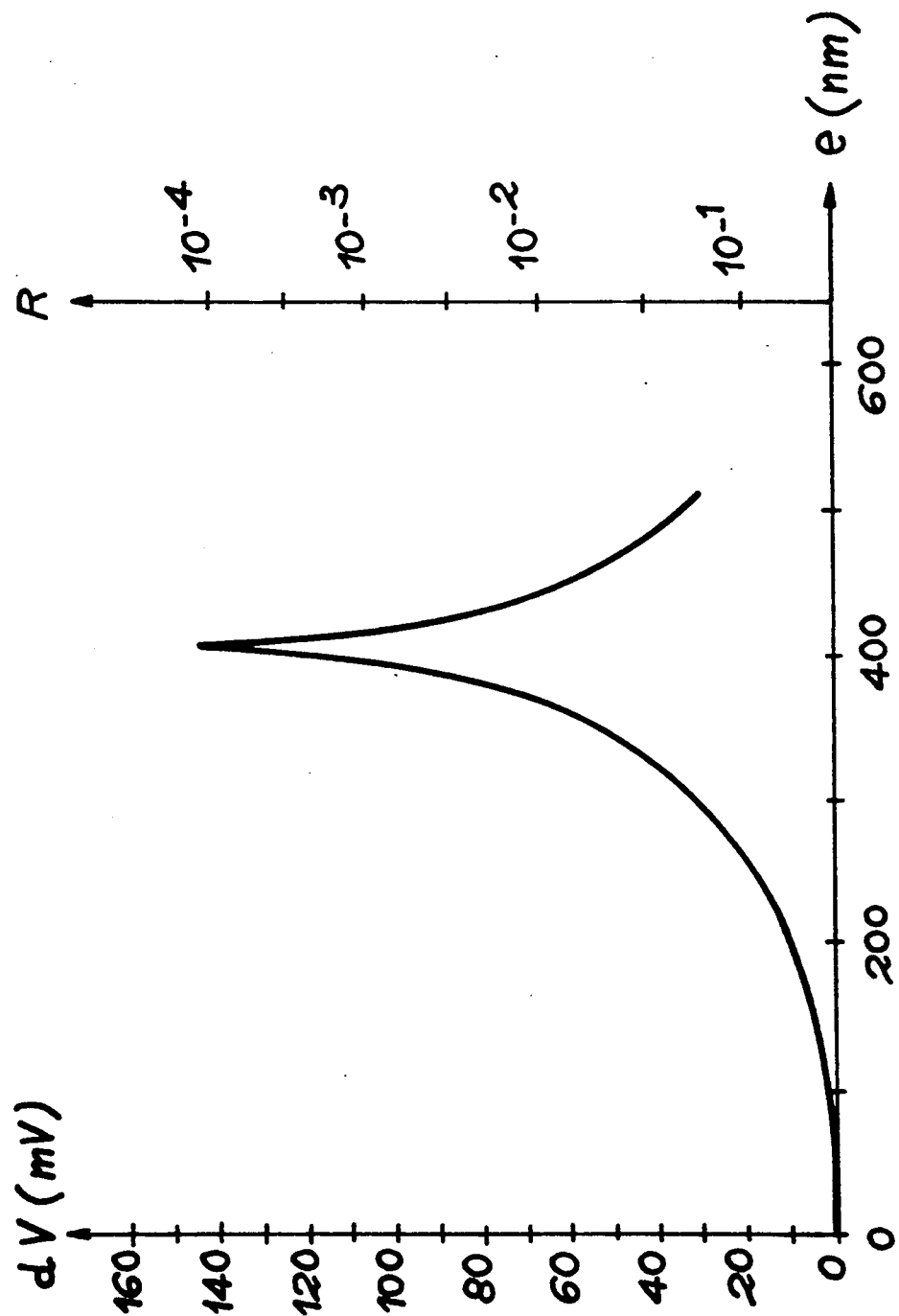
FIG. 2 shows a curve plotted with an installation according to the present invention.

A recorder 35 is connected to the second output S2 of the computer 32 and records the variations of dV as a function of the thickness e. FIG. 2 shows an example of a curve representing these variations. This curve corresponds to a semiconducting structure with a length of 300 $\mu$m and supplied by a constant current equal to nine times the threshold. The coatings alternately deposited on the two faces had, on each occasion, a thickness of 10 $\mu$m. On the ordinate to the left is plotted the voltage variation dV expressed in millivolt and to the right the overall reflectivity. On the abscissa is plotted the thickness in nonometres. The optimum anti-reflection treatment is obtained for a thickness of 400 nm, which corresponds to 40 "elementary" deposits of 10 nm each. The finally obtained reflectivity is $10^{-4}$ on each of the two faces.

We claim:

1. A process for depositing anti-reflection coatings on faces of a non-resonating optical amplifier (15) and for checking a thickness of said coatings in which, during deposition of the coatings, the optical amplifier is supplied with a constant current (16) and a voltage (V) at terminals of the optical amplifier is measured to determine when the coating thickness is optimum, said amplifier (15) comprising two faces and deposition alternately takes place on each of the two faces (15-1, 15-2) using successive elementary deposits of limited thickness so that the two faces (15-1, 15-2) are treated simultaneously and symmetrically, wherein when the measured voltage exceeds a maximum indicates that an overall minimum reflectivity has been obtained for the two coatings and deposition is then stopped.

2. An apparatus for deposition of anti-reflection coatings on two faces (15-1, 15-2) of a non-resonating optical amplifier (15) and for checking coating thickness (e), said installation comprising a deposition enclosure (10) equipped with a sample holder (14) for receiving the optical amplifier (15) and a sputtering means (12), a constant current source (16) is connected to the sample holder (14) and adapted to supply the optical amplifier (15) with current during deposition, said apparatus further comprising means (21) for pivoting the sample holder (14) by a half-turn so that each of the two faces (15-1, 15-2) of the amplifier are alternately presented to the sputtering means (12), a voltmeter (34) measuring voltage (V) at terminals of the optical amplifier (15), and voltage detection means (32) to detect when said measured voltage (V) passes through a maximum and for controlling the operation of the sputtering means (12).

3. An apparatus according to claim 2, further comprising thickness measuring means (30, 31) for measuring the thickness (e) of the coating deposited upon the two faces.

4. An apparatus according to claim 3, wherein the voltage detection means comprises a computer (32), said computer having a first input (E1) connected to the voltmeter (34) and receiving from the latter the measured voltage (V) and a second input (E2) connected to the thickness measuring means (30, 31), said computer calculating voltage variation (dV), thickness variation (de), and a ratio of voltage variation to thickness variation (dV/de) and determining when said ratio becomes zero, said computer having a first output (S1) supplying a stop signal to the sputtering means (12) when the ratio (dV/de) becomes zero.

5. An apparatus according to claim 4, wherein the computer (32) also has a second output (S2) supplying the quantities of voltage variation (dV) and coating thickness (e).

6. An apparatus according to claim 2, further comprising a retractable mask (23) and a motor, said mask being located in the enclosure (10) between the sputtering means (12) and the sample holder (14) and said motor (25) being provided to move the mask relative to the sputtering means (12) and the sample holder (14).

7. An apparatus according to claim 4, wherein the computer (32) also has a third output (S3) controlling the means (21) for pivoting the sample holder (14) by a half-turn, a fourth output (S4) for controlling a motor (25) which acts upon a retractable mask (23) during pivoting of the sample holder (14).

8. An apparatus according to claim 5, further comprising a recorder (35), said recorder being connected to the second output (S2) of the computer (32) and recording the voltage variations (dV) as a function of the thickness (e).

* * * * *